(12) United States Patent
Jiang

(10) Patent No.: US 8,889,444 B2
(45) Date of Patent: Nov. 18, 2014

(54) METHOD OF MANUFACTURING TRANSISTOR, TRANSISTOR, ARRAY SUBSTRATE AND DISPLAY DEVICE

(71) Applicant: Boe Technology Group Co., Ltd., Beijing (CN)

(72) Inventor: Chunsheng Jiang, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/876,630

(22) PCT Filed: Nov. 28, 2012

(86) PCT No.: PCT/CN2012/085476
§ 371 (c)(1),
(2), (4) Date: Mar. 28, 2013

(87) PCT Pub. No.: WO2013/143311
PCT Pub. Date: Oct. 3, 2013

(65) Prior Publication Data
US 2014/0054701 A1 Feb. 27, 2014

(30) Foreign Application Priority Data

Mar. 30, 2012 (CN) .......................... 2012 1 0091052
Apr. 26, 2012 (CN) .......................... 2012 1 0126730

(51) Int. Cl.
H01L 21/00 (2006.01)
H01L 33/00 (2010.01)

(52) U.S. Cl.
USPC ............................. 438/30; 257/83

(58) Field of Classification Search
USPC ................ 438/30, 82, 157–158; 257/79–84, 257/E33.001–E33.077
See application file for complete search history.

(56) References Cited

U.S. PATENT DOCUMENTS

| 5,793,072 | A | 8/1998 | Kuo |
| 6,191,831 | B1 | 2/2001 | Kim et al. |
| 7,863,602 | B2 * | 1/2011 | Huh et al. ........................ 257/40 |
| 7,969,523 | B2 * | 6/2011 | Chen ............................... 349/48 |
| 2012/0007084 | A1 | 1/2012 | Park et al. |

FOREIGN PATENT DOCUMENTS

| CN | 102315278 A | 1/2012 |
| CN | 102683193 A | 9/2012 |
| KR | 2004/0081885 A | 9/2004 |
| KR | 20040079475 A | 9/2004 |

OTHER PUBLICATIONS

First Chinese Office Action dated Feb. 17, 2014l Appln. No. 201210126730.7.

* cited by examiner

Primary Examiner — Calvin Lee
(74) Attorney, Agent, or Firm — Ladas & Parry LLP

(57) ABSTRACT

Embodiments of the present invention provide a method for manufacturing a transistor, a transistor, an array substrate and a display device. The method comprises: forming a first source/drain metal layer on a substrate; forming an insulating layer above the first source/drain metal layer; forming a gate metal layer on the insulating layer; forming a gate insulating layer on the gate metal layer; forming a semiconductor layer above the gate insulating layer; forming an etching blocking layer on the semiconductor layer; forming a second source/drain metal layer above the etching blocking layer; forming an insulating layer above the second source/drain metal layer.

13 Claims, 4 Drawing Sheets

METHOD OF MANUFACTURING TRANSISTOR, TRANSISTOR, ARRAY SUBSTRATE AND DISPLAY DEVICE

FIELD OF THE INVENTION

Embodiments of the present invention relate to a method of manufacturing a transistor, a transistor, an array substrate, and a display device.

BACKGROUND

Oxide thin film field effect transistor (Oxide TFT) is used in a back panel of a liquid crystal display (LCD) as a driver for a pixel region to control rotation of the liquid crystal such that different grey scales are produced in the pixel region. In an active matrix organic light-emitting diode (AMOLED) panel, the oxide TFT is used for controlling the brightness of an electroluminescent light emitting layer, so that different gray scales are produced in the pixel region. As illustrated in FIGS. 1A to 1F, the processes for manufacturing a double-bottom-gate OTFT are as follows:

First, a layer of metal (typically, molybdenum metal) is deposited on a substrate, and a double-bottom-gate structure including two identical gate metal layers 101 i.e. Gate layer 101, is formed after etching, as illustrated in FIG. 1A;

Second, a layer of insulating material is applied above the Gate layer 101 so as to form a gate insulating (Gate Insulator, GI) layer 102, as illustrated in FIG. 1B;

Third, indium gallium zinc oxide (IGZO) is applied above the GI layer 102 so as to form an IGZO layer 103 as illustrated in FIG. 1C, and the IGZO layer may be used as the semiconductor layer of the OTFT;

Fourth, an inorganic nonmetallic material is deposited on the IGZO layer 103, and a blocking layer 104 is formed after etching the material, as illustrated in FIG. 1D; the blocking layer is used to prevent the IGZO layer from being damaged during subsequent etching a source metal layer and a drain metal layer;

Fifth, a layer of metal is deposited above the blocking layer 104, and a source metal layer 106 as a source electrode, a drain metal layer 105 as a drain electrode, and an intermediate metal layer 107 are formed after etching the layer of metal, respectively, as illustrated in FIG. 1E;

Sixth, PVX is deposited above the source metal layer, the drain metal layer and the intermediate metal layer, and an insulating layer 108 is formed, as illustrated in FIG. 1F.

The operation principle of the OTFT is described as follows by taking a double-bottom-gate OTFT in an AMOLED as an example.

Firstly, a digital signal, i.e., Data signal, is applied to the source metal layer; Secondly, a voltage is applied to the gate metal layer; when the voltage is greater than a certain value, the IGZO layer becomes to a conducting state and carriers are generated therein. At this time, the digital signal applied to the source metal layer can be transmitted to the drain metal layer through the carriers, and the electroluminescent light emitting material connected with the drain emits light.

However, the inventors have found that, the OTFT with the double-bottom-gate structure produced in the prior art occupies a relatively large area in the pixel region. For example, if the OTFT has an aspect ratio of W/L=18/9, then it can be known that the width of the double-gate has a minimum width of 40 μm. As such, it will exert a large influence on the aperture ratio of an array substrate with a pixel size of 50×200 μm. The aperture ratio refers to a ratio of the area of an actual light-transmitting region to the total area of the unit pixel within a unit pixel. Obviously, the higher the aperture ratio is, the higher the light transmittance is. Therefore, if the area of the double-gate area is larger, the aperture ratio is smaller and the light transmittance is lower.

SUMMARY

An embodiment of the present invention provides a method of manufacturing a transistor, comprising: forming a first source/drain metal layer on a substrate; forming an insulating layer above the first source/drain metal layer; the insulating layer comprising a first insulating region and a second insulating region, the first insulating region and the second insulating region being disposed oppositely with respect to a central line of the first source/drain metal layer with a blank area therebetween; forming a gate metal layer on the insulating layer, the gate metal layer comprising a first gate electrode region and a second gate electrode region, and the first gate electrode region covering the first insulating region, the second gate electrode region covering the second insulating region; forming a gate insulating layer on the gate metal layer; forming a semiconductor layer above the gate insulating layer, an orthographic projection region of the first source/drain metal layer on the substrate is within an orthographic projection region of the semiconductor layer on the substrate; forming an etching blocking layer on the semiconductor layer, an orthographic projection region of the blank area between the first insulating region and the second insulating region on the substrate is within an orthographic projection region of the etching blocking layer on the substrate; forming a second source/drain metal layer above the etching blocking layer, the second source/drain metal layer comprising a source electrode region and a drain electrode region, an orthographic projection region of an overlapping portion of the semiconductor layer and the first gate electrode region on the substrate is within an orthographic projection region formed by the source electrode region on the substrate, an orthographic projection region of an overlapping portion of the semiconductor layer and the second gate electrode region on the substrate is within an orthographic projection region formed by the drain electrode region on the substrate; and forming an insulating layer above the second source/drain metal layer.

Another embodiment of the present invention provides a transistor comprising: a substrate and a first source/drain metal layer located on the substrate; a first insulating region and a second insulating region covering a portion of the first source/drain metal layer, the first insulating region and the second insulating region being disposed oppositely with respect to a central line of the first source/drain metal layer with a blank area therebetween; a first gate electrode region covering the first insulating region and a second gate electrode region covering the second insulating region; a gate insulating layer covering the first gate electrode region and the second gate electrode region; a semiconductor layer located above the gate insulating layer, and an orthographic projection region of the first source/drain metal layer on the substrate is within an orthographic projection region of the semiconductor layer on the substrate; an etching blocking layer located on the semiconductor layer, and an orthographic projection region of the blank area on the substrate is within an orthographic projection region of the etching blocking layer on the substrate; a source electrode region and a drain electrode region located above the etching blocking layer, respectively, an orthographic projection region of an overlapping portion of the semiconductor layer and the first gate electrode region on the substrate is within an orthographic projection region formed by the source electrode region on the substrate, an orthographic projection region of an overlapping portion of the semiconductor layer and the second gate electrode region on the substrate is within an orthographic projection region formed by the drain electrode region on the substrate; and an insulating layer covering the source electrode region, the drain electrode region, the gate insulating layer and the etching blocking layer.

A further embodiment of the present invention provides an array substrate comprising the transistor as mentioned above.

Still another embodiment of the present invention provides a display device comprising the array substrate as mentioned above.

With the method of manufacturing a transistor provided by embodiments of the present invention, two OTFTs sharing the same first source/drain metal layer can be obtained. As illustrated in FIG. 2H, the OTFT at the left side has a configuration from the bottom to the top including: a first source/drain metal layer, a first insulating region, a first gate electrode region, a gate insulating layer, a semiconductor layer, an etching blocking layer and a source electrode region; the OTFT at the right side has a configuration from the bottom to the top including: the first source/drain metal layer, a second insulating region, a second gate electrode region, the gate insulating layer, the semiconductor layer, the etching blocking layer and a source electrode region. It can be seen that the two OTFTs formed by the method share one first source/drain metal layer, and the first source/drain metal layer can function as a source metal layer in one OTFT, and as a drain metal layer in another OTFT, and each OTFT has its own gate electrode; in addition, the two OTFTs have their source electrode, gate electrode, and drain electrode formed in the vertical direction, respectively. As such, with the double-gate OTFT with a vertical structure formed by the method, it is possible to greatly reduce the area occupied by the transistor with double-bottom-gate structure in the prior art and enhance the aperture ratio of the array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1A:
FIG. 1A is a schematic structural view of a first structure formed in the process of fabricating a transistor in the prior art.
Figure 1B:
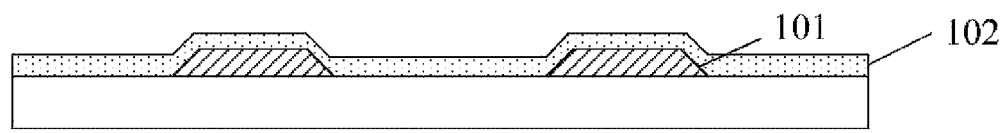
FIG. 1B is a schematic structural view of a second structure formed in the process of fabricating the transistor in the prior art.
Figure 1C:
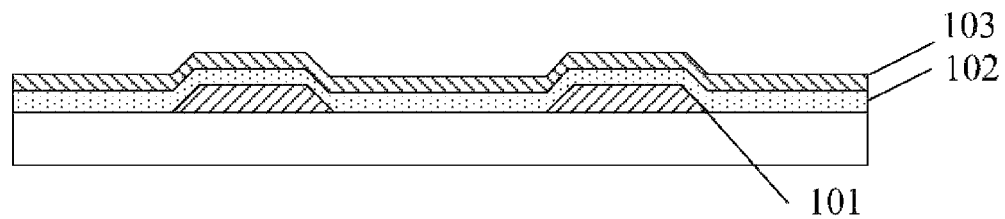
FIG. 1C is a schematic structural view of a third structure formed in the process of fabricating the transistor in the prior art.
Figure 1D:
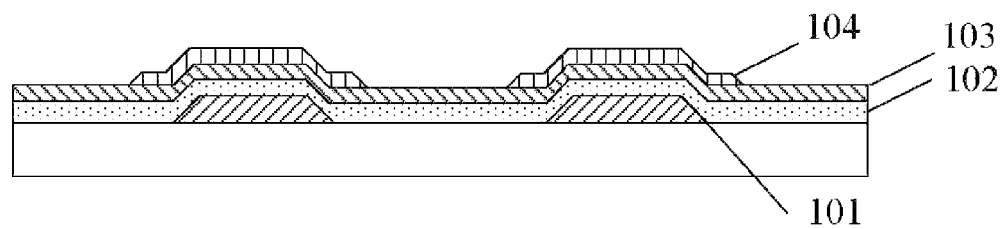
FIG. 1D is a schematic structural view of a fourth structure formed in the process of fabricating the transistor in the prior art.
Figure 1E:
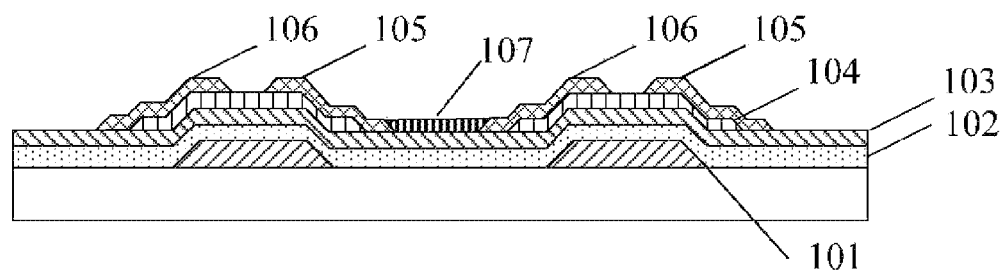
FIG. 1E is a schematic structural view of a fifth structure formed in the process of fabricating the transistor in the prior art.
Figure 1F:
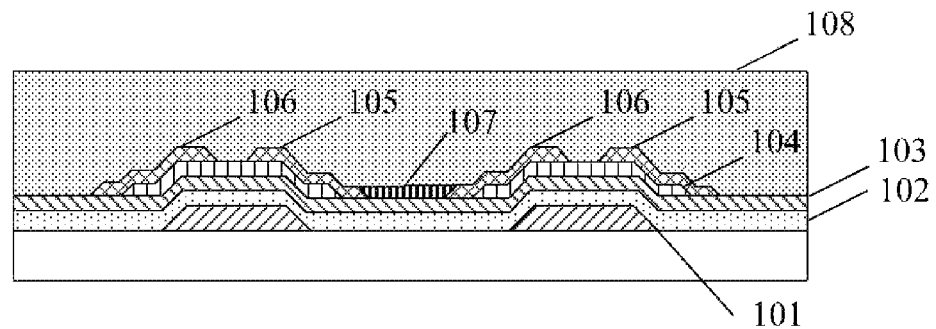
FIG. 1F is a schematic structural view of a sixth structure formed in the process of fabricating the transistor in the prior art.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

With the method of manufacturing a transistor provided by embodiments of the present invention, two OTFTs sharing the same first source/drain metal layer can be obtained. As illustrated in FIG. 2H, the OTFT at the left side has a configuration from the bottom to the top including: a first source/drain metal layer, a first insulating region, a first gate electrode region, a gate insulating layer, a semiconductor layer, an etching blocking layer and a source electrode region; the OTFT at the right side has a configuration from the bottom to the top including: the first source/drain metal layer, a second insulating region, a second gate electrode region, the gate insulating layer, the semiconductor layer, the etching blocking layer and a source electrode region. It can be seen that the two OTFTs formed by the method share one first source/drain metal layer, and the first source/drain metal layer can function as a source metal layer in one OTFT, and as a drain metal layer in another OTFT, and each OTFT has its own gate electrode; in addition, the two OTFTs have their source electrode, gate electrode, and drain electrode formed in the vertical direction, respectively. As such, with the double-gate OTFT with a vertical structure formed by the method, it is possible to greatly reduce the area occupied by the transistor with double-bottom-gate structure in the prior art and enhance the aperture ratio of the array substrate. Specifically, the discrimination with the left side and the right side in the embodiments of the present invention embodiment is only suitable for drawings provided in the embodiments of the invention. The manufacturing method according to an embodiment of the present invention comprises the steps of:

Step 21, forming a first source/drain metal layer on a substrate;

Step 22, forming an insulating layer above the first source/drain metal layer, the insulating layer comprising a first insulating region and a second insulating region, wherein the first insulating layer partially covers one side of the first source/drain metal layer, the second insulating layer partially covers another side of the first source/drain metal layer, and the remaining parts of the first and second insulating layers are located on the substrate;

Step 23, forming a gate metal layer on the insulating layer, the gate metal layer comprising a first gate electrode region and a second gate electrode region, and the first gate electrode region covering the first insulating region, the second gate electrode region covering the second insulating region;

Step 24, forming a gate insulating layer on the gate metal layer;

Step 25, forming a semiconductor layer above the gate insulating layer, an orthographic projection region of the first source/drain metal layer on the substrate is within an orthographic projection region of the semiconductor layer on the substrate;

Step 26, forming an etching blocking layer on the semiconductor layer, an orthographic projection region of a blank area between the first insulating region and the second insulating region on the substrate is within an orthographic projection region of the etching blocking layer on the substrate;

Step 27, forming a second source/drain metal layer above the etching blocking layer, the second source/drain metal layer comprising a source electrode region and a drain electrode region, an orthographic projection region of an overlapping portion of the semiconductor layer and the first gate electrode region on the substrate is within an orthographic projection region formed by the source electrode region on the substrate, an orthographic projection region of an overlapping portion of the semiconductor layer and the second gate electrode region on the substrate is within an orthographic projection region formed by the drain electrode region on the substrate;

Step 28, forming an insulating layer above the second source/drain metal layer.

For example, forming the gate insulating layer above the gate metal layer includes, but not limited to, the following methods:

Depositing a silicon nitride based or silicon oxide based material above the gate metal layer by chemical vapor deposition, and forming the gate insulating layer.

For example, after forming the gate insulating layer, a part of it corresponding to the blank area between the first insulating region and the second insulating region can be retained, or the gate insulating layer in the blank area may also be etched off.

For example, forming the semiconductor layer above the gate insulating layer includes, but not limited to, the following methods:

Sputtering indium gallium zinc oxide above the gate insulating layer and forming the semiconductor layer after performing an etching process on the indium gallium zinc oxide.

For example, forming the insulating layer above the second source/drain metal layer includes, but are not limited to, the following method:

Depositing an insulating material above the second source/drain metal layer by chemical vapor deposition so as to form the insulating layer.

With the method provided by the embodiments of the present invention, two OTFTs can share one first source and a drain metal layer; i.e., the first source/drain metal layer is used as the source electrode in one of the OTFTs, and as the drain electrode in the other OTFT. It can be seen that this structure can reduce the area occupied by the source/drain electrodes in the prior art.

With the method provided by the embodiments of the present invention, the gate electrode, the source electrode and the drain electrode of each OTFT are arranged in the vertical direction, which can reduce the area occupied by the OTFT comparing with that in the prior art. Therefore, it is possible to improve the aperture ratio of the array substrate.

Some specific embodiments are described hereinafter.

Embodiment

As illustrated in FIG. 2A-FIG. 2H, the embodiment of the invention provides a method of manufacturing a transistor. With the method, a double-gate OTFT with a vertical structure sharing the same source/drain metal layer can be obtained, and therefore, the area occupied by the OTFT is significantly reduced, and the aperture ratio of the array substrate is increased. The method is described as follows.

Figure 2A:
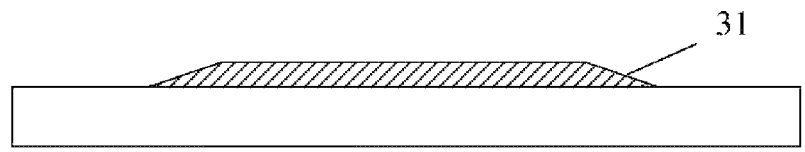
FIG. 2A is a schematic structural view of a metal layer of the transistor provided by an embodiment of the present invention.

Step one, as illustrated in FIG. 2A, a first source/drain metal layer 31 is formed on a substrate.

For example, the first source/drain metal layer 31 can be formed by sputtering a layer of metal on the substrate and etching the layer of metal.

In one example, the first source/drain metal layer 31 may employ metals such as molybdenum, molybdenum/aluminum/molybdenum.

For example, upon the first source/drain metal layer being used as the source electrode of one OTFT, it is used as the drain electrode of the other OTFT.

Figure 2B:
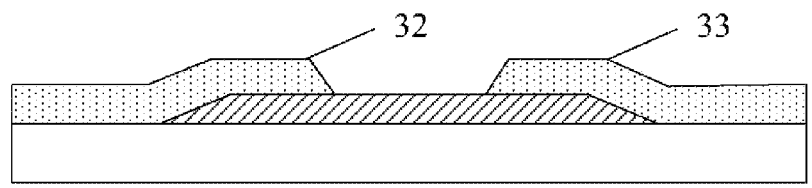
FIG. 2B is a first schematic structural view of the transistor provided by the embodiment of the present invention.

Step two, as illustrated in FIG. 2B, an insulating layer including a first insulating region 32 and a second region 33 is formed above the first source/drain metal layer 31, and the first insulating region 32 partially covers one side of the first source/drain metal layer 31, the second insulating region 33 partially covers another side of the first source/drain metal layer 31, and the remaining portions of the first insulating region 32 and the second insulating region 33 are located on the substrate.

For example, the insulating layer may be formed by spin coating a layer of insulating material above the first source/drain metal layer 31 and performing an etching process on the layer of insulating material.

For example, a blank area exists between the resultant first insulating region 32 and second insulating region 33.

For example, the first insulating region 32 and the second insulating region 33 are arranged oppositely with respect to the central line of the first source/drain metal layer so as to cover a part of the first source/drain metal layer at both sides of the central line and expose the first source/drain metal layer in the blank area.

In one example, in order to simplify the complexity of the manufacturing process, a resin material with photosensitivity, e.g., PDI1000, may be used as the insulating material. In this case, a photo etching process can be used.

Figure 2C:
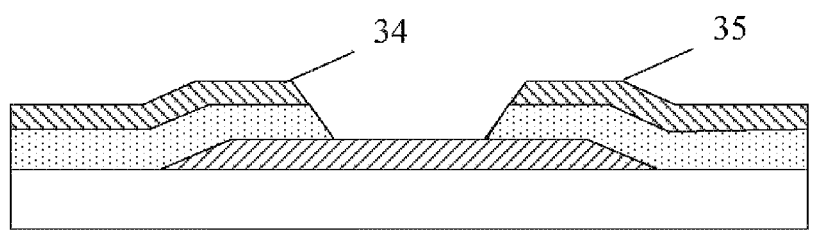
FIG. 2C is a second schematic structural view of the transistor provided by the embodiment of the present invention.

Step three, as illustrated in FIG. 2C, a gate metal layer including a first gate electrode region 34 and a second gate electrode region 35 is formed on the insulating layer, and the first gate electrode region 34 covers the first insulating region 32, the second gate electrode region 35 covers the second insulating region 33.

For example, the gate metal layer can be formed by sputtering metal on the insulating layer and performing an etching process on the metal.

For example, between the first gate electrode region 34 and the second gate electrode region 35 is a space corresponding to the blank area between the first insulating region 32 and the second insulating region 33.

In one example, the metal used in this step may be a metal such as molybdenum, molybdenum/aluminum/molybdenum.

Figure 2D:
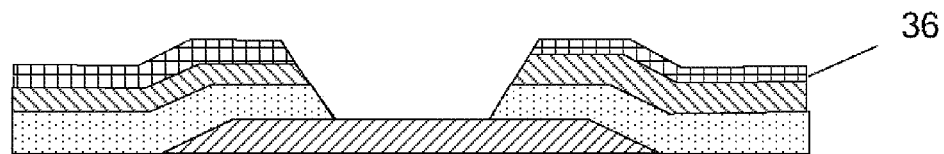
FIG. 2D is a third schematic structural view of the transistor provided by the embodiment of the present invention.

Step four, as illustrated in FIG. 2D, a gate insulating layer 36 is formed on the gate metal layer, and the gate insulating layer 36 in the blank area (i.e., the bottom of the U-shaped structure in the figure) is etched off by a dry etch method.

For example, the gate insulating layer 36 may be formed by depositing silicon nitride or silicon oxide based compound on the gate metal layer by chemical vapor deposition. In the embodiment, the part of the gate insulating layer corresponding to the blank area is etched off. However, the present invention is not limited thereto. In other embodiments of the invention, the gate insulating layer in the blank area can also be retained.

Figure 2E:
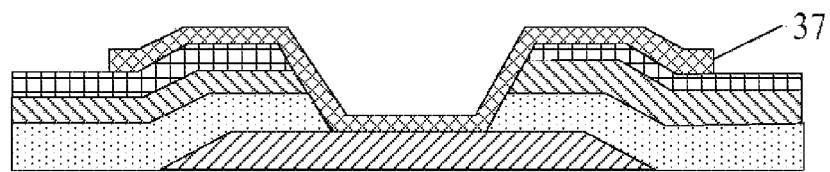
FIG. 2E is a fourth schematic structural view of the transistor provided by the embodiment of the present invention.

Step five, a semiconductor layer 37 is formed above the gate insulating layer 36, as illustrated in FIG. 2E. An orthographic projection region of the first source/drain metal layer 31 on the substrate is within an orthographic projection region formed by the semiconductor layer 37 on the substrate.

For example, the semiconductor layer 37 may be formed by sputtering indium gallium zinc oxide (IGZO) above the gate insulating layer 36 and performing an etching process on the IGZO.

Figure 2F:
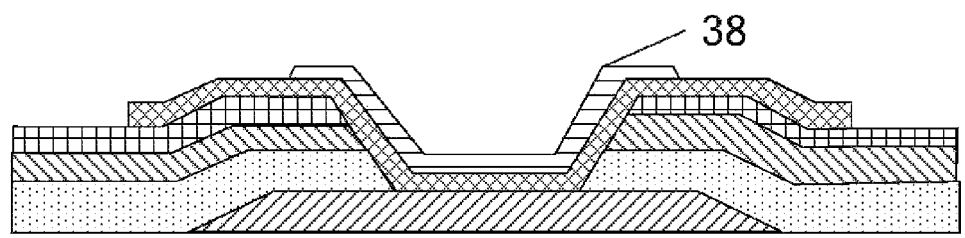
FIG. 2F is a fifth schematic structural view of the transistor provided by the embodiment of the present invention.

Step six, an etching blocking layer 38 is formed on the semiconductor layer 37, as illustrated in FIG. 2F. An orthographic projection region of the blank area between the first insulating region 32 and the second insulating region 33 on the substrate is within an orthographic projection region formed by the etching blocking layer 38 on the substrate.

For example, the etching blocking layer 38 may be formed by sputtering an inorganic nonmetallic material on the semiconductor layer 37 and performing an etching process on the material.

Figure 2G:
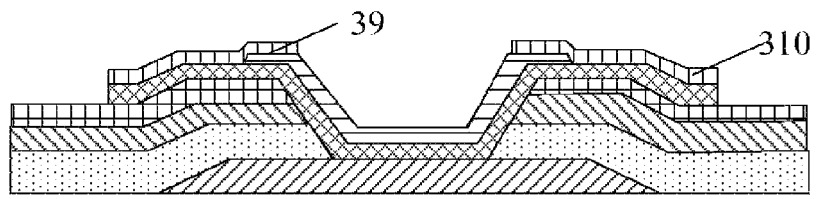
FIG. 2G is a sixth schematic structural view of the transistor provided by the embodiment of the present invention.
Figure 2H:
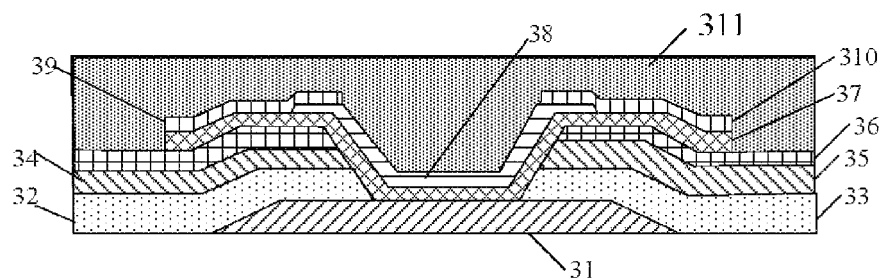
FIG. 2H is a seventh schematic structural view of the transistor provided by the embodiment of the present invention.

Step seven, a second source/drain metal layer including a source electrode region 39 and a drain electrode region 310 is formed above the etching blocking layer 38, as illustrated in FIG. 2G, wherein, an orthographic projection region of an overlapping portion of the semiconductor layer 37 and the first gate electrode region 34 on the substrate is within an orthographic projection region formed by the source electrode region 39 on the substrate; an orthographic projection region of an overlapping portion of the semiconductor layer 37 and the second gate electrode region 35 on the substrate is within an orthographic projection region formed by the drain electrode region 310 on the substrate.

For example, the second source/drain metal layer 38 may be formed by sputtering a metal material above the etching blocking layer 38 and performing an etching process on the metal material.

In one example, the metal used in this step may be metals such as molybdenum, molybdenum/aluminum/molybdenum.

Step eight, an insulating layer 311 is formed above the second source/drain metal layer, as illustrated in FIG. 2H.

For example, the insulating layer 311 may be formed by depositing an insulating material above the second source/drain metal layer by chemical vapor deposition.

In one example, the insulating material used in this step may be SiOx.

For example, the blank area is located at an intermediate position of the first source/drain metal layer 31, i.e., the shape of the orthographic projection region formed by the first insulating region 32 on the first source/drain metal layer 31 is the same as that formed by the second insulating region 33 on the first source/drain metal layer 31; the area of the orthographic projection region formed by the first insulating region 32 on the first source/drain metal layer 31 is the equal to that formed by the second insulating region 33 on the first source/drain metal layer 31.

For example, the shape of the orthographic projection region formed by the first gate electrode region 34 on the substrate is the same as that formed by the second gate electrode region 35 on the substrate; the area of the orthographic projection region formed by the first gate electrode region 34 on the substrate is the equal to that formed by the second gate electrode region 35 on the substrate.

For example, the shape of the orthographic projection region formed by the source electrode region 39 on the substrate is the same as that formed by the drain electrode region 310 on the substrate; the area of the orthographic projection region formed by the source electrode region 39 on the substrate is the equal to that formed by the drain electrode region 310 on the substrate.

A double-gate OTFT with a vertical structure can be obtained by the above steps, as illustrated in FIG. 2H. With the blank area as a boundary, each side of the blank area has an OTFT with the vertical structure. At the left side, the resultant OTFT has a configuration including, from the bottom to the top, the first source/drain metal layer 31, the first insulating region 32, the first gate electrode region 34, the gate insulating layer 36, the semiconductor layer 37, the etching blocking layer 38, and the source electrode region 39; at the right side, the resultant OTFT has a configuration including, from the bottom to the top, the first source/drain metal layer 31, the second insulating region 33, the second gate electrode region 35, the gate insulating layer 36, the semiconductor layer 37, the etching blocking layer 38, and the drain electrode region 310.

For example, upon the first source/drain metal layer 31 functioning as a source electrode in the OTFT at the left side, the source electrode region 39 functions as a drain electrode; upon the first source/drain metal layer 31 functioning as a drain electrode in the OTFT at the right side, the drain electrode region 310 functions as a source electrode.

For example, upon the first source/drain metal layer 31 having a width of 4 μm and a length of 2 μm and the blank area having a width of 3.8 μm and a length of 2 μm, by taking the OTFT at the left side as an example, the width of the region for the first source/drain metal layer 31 and the source electrode region 39 overlapping in the vertical direction is 0.1 μm. In this case, the electric field has a relatively larger intensity which better meets the requirement of the electrical properties, thus a better switching effect can be obtained.

In one example, both the source electrode region 39 and the drain electrode region 310 can have a width of 4 μm, and the blank area has a width of 3.8 μm. In this case, the width of the resultant double-gate OTFT having a vertical structure is less than 12 μm, which is far less than 40 μm in the prior art.

As illustrated in FIG. 2H, an embodiment of the present invention provides a transistor, the transistor comprising:

a first insulating region partially covering one side of a first source/drain metal layer, a second insulating region partially covering another side of the first source/drain metal layer, and the remaining parts of the first insulating region and the second insulating region being located on the substrate;

a first gate electrode region covering the first insulating region and a second gate electrode region covering the second insulating region;

a gate insulating layer covering the first gate electrode region and the second gate electrode region;

a semiconductor layer located above the gate insulating layer, and an orthographic projection region of the first source/drain metal layer on the substrate is within an orthographic projection region of the semiconductor layer on the substrate;

an etching blocking layer located on the semiconductor layer, and an orthographic projection region of the blank area on the substrate is within an orthographic projection region of the etching blocking layer on the substrate;

a source electrode region and a drain electrode region located above the etching blocking layer, respectively, an orthographic projection region of an overlapping portion of the semiconductor layer and the first gate electrode region on the substrate is within an orthographic projection region formed by the source electrode region on the substrate, an orthographic projection region of an overlapping portion of the semiconductor layer and the second gate electrode region on the substrate is within an orthographic projection region formed by the drain electrode region on the substrate; and an insulating layer covering the source electrode region, the drain electrode region, the gate insulating layer and the etching blocking layer.

In one example, orthographic projection regions formed by the first insulating region and the second insulating region on the first source/drain metal layer are the same in shape and area.

In one example, orthographic projection regions formed by the first gate electrode region and the second gate electrode region on the substrate are the same in shape and area.

In one example, orthographic projection regions formed by the first gate electrode region and the second gate electrode region on the substrate are the same in shape and area.

In one example, a width of orthographic projection regions formed by the first gate electrode region and the second gate electrode region on the first source/drain metal layer is 0.1 μm.

The embodiments of the invention also provide an array substrate, the array substrate includes any of the above-mentioned transistors.

The embodiments of the invention further provide a display apparatus, the display device includes the above-mentioned array substrate.

In summary, the following beneficial effects can be obtained:

With the method of manufacturing a transistor provided by the embodiments of the present invention, two OTFTs sharing the same first source/drain metal layer can be obtained. As illustrated in FIG. 2H, the OTFT at the left side has a configuration from the bottom to the top including: a first source/drain metal layer, a first insulating region, a first gate electrode region, a gate insulating layer, a semiconductor layer, an etching blocking layer and a source electrode region; the OTFT at the right side has a configuration from the bottom to the top including: the first source/drain metal layer, a second insulating region, a second gate electrode region, the gate insulating layer, the semiconductor layer, the etching blocking layer and a source electrode region. It can be seen that the two OTFTs formed by the method share one first source/drain metal layer, and the first source/drain metal layer can function as a source metal layer in one OTFT, and as a drain metal layer in another OTFT, and each OTFT has its own gate; in addition, the two OTFTs have their source electrode, gate electrode, and drain electrode formed in the vertical direction, respectively. As such, with the double-gate OTFT with a vertical structure formed by the method, it is possible to greatly reduce the area occupied by the transistor comparing that with a double-bottom-gate structure in the prior art and enhance the aperture ratio of the array substrate.

In one example, both the source electrode region and the drain electrode region of the transistor according to the embodiments of the invention have a width of 4 μm, and the blank area has a width of 3.8 μm. In this case, the width of the resultant double-gate OTFT having a vertical structure is less than 12 μm, which is far less than 40 μm in the prior art.

Figure 3:
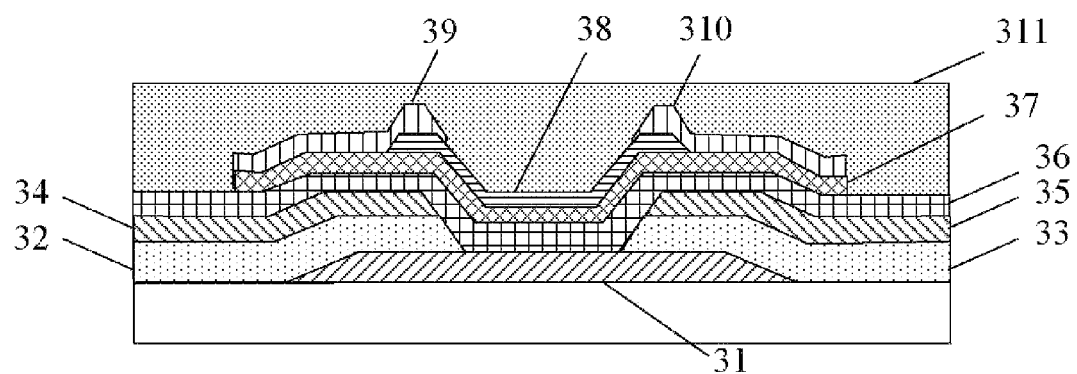
FIG. 3 is a configuration diagram of another transistor provided by an embodiment of the present invention.

It should be noted that, according to the above embodiments, the gate insulating layer 36 is formed on the gate metal layer, and the gate insulating layer in the blank area (i.e., the bottom of the U-shaped structure) is etched. However, the gate insulating layer can also cover the blank area between the first insulating region and the second insulating region, specifically, as illustrated in FIG. 3. FIG. 3 is a structural diagram of another transistor provided by the embodiments of the invention. As the gate insulating layer has a relatively small thickness, the semiconductor layer can be communicated with the first source/drain metal layer through the breakdown of the gate insulating layer so as to achieve the function of the TFT.

The embodiments of the present invention are not limited to the OTFT, and may also applied to other TFTs, such as a-Si TFT and low-temperature polysilicon TFT.

Although some specific embodiments of the invention are described, additional modifications and alternations can be made upon those skilled obtaining the basic inventive concept. Therefore, the appended claims is interpreted as that they encompass the preferred embodiments and all of the modifications and alternations falling into the protection scope of the invention.

The foregoing are merely exemplary embodiments of the invention, but are not used to limit the protection scope of the invention. The protection scope of the invention shall be defined by the attached claims.

What is claimed is:

1. A method of manufacturing a transistor, comprising:
   forming a first source/drain metal layer on a substrate;
   forming an insulating layer above the first source/drain metal layer, the insulating layer comprising a first insulating region and a second insulating region, the first insulating region and the second insulating region being disposed oppositely with respect to a central line of the first source/drain metal layer with a blank area therebetween;
   forming a gate metal layer on the insulating layer, the gate metal layer comprising a first gate electrode region and a second gate electrode region, and the first gate electrode region covering the first insulating region, the second gate electrode region covering the second insulating region;
   forming a gate insulating layer on the gate metal layer;
   forming a semiconductor layer above the gate insulating layer, an orthographic projection region of the first source/drain metal layer on the substrate is within an orthographic projection region of the semiconductor layer on the substrate;
   forming an etching blocking layer on the semiconductor layer, an orthographic projection region of the blank area between the first insulating region and the second insulating region on the substrate is within an orthographic projection region of the etching blocking layer on the substrate;
   forming a second source/drain metal layer above the etching blocking layer, the second source/drain metal layer comprising a source electrode region and a drain electrode region, an orthographic projection region of an overlapping portion of the semiconductor layer and the first gate electrode region on the substrate is within an orthographic projection region formed by the source electrode region on the substrate, an orthographic projection region of an overlapping portion of the semiconductor layer and the second gate electrode region on the substrate is within an orthographic projection region formed by the drain electrode region on the substrate; and forming an insulating layer above the second source/drain metal layer.

2. The method according to claim 1, further comprising: after forming the gate insulating layer on the gate metal layer and before forming the semiconductor layer, etching off the gate insulating layer in the blank area.

3. The method according to claim 1, wherein forming the semiconductor layer above the gate insulating layer comprises:

sputtering indium gallium zinc oxide above the gate insulating layer, and forming the semiconductor layer after performing an etching process on the indium gallium zinc oxide.

4. The method according to claim 1, wherein forming the etching blocking layer on the semiconductor layer comprises:

sputtering an inorganic nonmetallic material on the semiconductor layer, and forming the etching blocking layer after performing an etching process on the inorganic nonmetallic material.

5. The method according to claim 1, wherein forming the insulating layer above the second source/drain metal layer comprises:

depositing an insulating material above the second source/drain metal layer by chemical vapor deposition so as to form the insulating layer.

6. The method according to claim 1, wherein the first insulating region and the second insulating region are formed in such a way that they cover a portion of the first source/drain metal layer on both sides of the centerline, and the first source/drain metal layer is exposed in the blank area.

7. A transistor, comprising:

a substrate and a first source/drain metal layer located on the substrate;

a first insulating region and a second insulating region covering a portion of the first source/drain metal layer, the first insulating region and the second insulating region being disposed oppositely with respect to a central line of the first source/drain metal layer with a blank area therebetween;

a first gate electrode region covering the first insulating region and a second gate electrode region covering the second insulating region;

a gate insulating layer covering the first gate electrode region and the second gate electrode region;

a semiconductor layer located above the gate insulating layer, and an orthographic projection region of the first source/drain metal layer on the substrate is within an orthographic projection region of the semiconductor layer on the substrate;

an etching blocking layer located on the semiconductor layer, and an orthographic projection region of the blank area on the substrate is within an orthographic projection region of the etching blocking layer on the substrate;

a source electrode region and a drain electrode region located above the etching blocking layer, respectively, an orthographic projection region of an overlapping portion of the semiconductor layer and the first gate electrode region on the substrate is within an orthographic projection region formed by the source electrode region on the substrate; an orthographic projection region of an overlapping portion of the semiconductor layer and the second gate electrode region on the substrate is within an orthographic projection region formed by the drain electrode region on the substrate; and an insulating layer covering the source electrode region, the drain electrode region, the gate insulating layer and the etching blocking layer.

8. The transistor according to claim 7, wherein the gate insulating layer also covers the blank area.

9. The transistor according to claim 7, wherein orthographic projection regions formed by the first insulating region and the second insulating region on the first source/drain metal layer are the same in shape and area.

10. The transistor according to claim 7, wherein orthographic projection regions formed by the first gate electrode region and the second gate electrode region on the substrate are the same in shape and area.

11. The transistor according to claim 7, wherein a width of orthographic projection regions formed by the first gate electrode region and the second gate electrode region on the first source/drain metal layer is 0.1 μm.

12. The transistor according to claim 7, wherein the first insulating region and the second insulating region cover a portion of the first source/drain metal layer on both sides of the centerline, and the first source/drain metal layer is exposed in the blank area.

13. An array substrate, comprising the transistor according to claim 7.

* * * * *